US00RE42444E

(19) United States
(12) Reissued Patent
Smith et al.

(10) Patent Number: US RE42,444 E
(45) Date of Reissued Patent: Jun. 7, 2011

(54) METHOD FOR MANAGING RESOURCES IN A RECONFIGURABLE COMPUTER HAVING PROGRAMMABLE LOGIC RESOURCES WHERE AUTOMATICALLY SWAPPING CONFIGURATION DATA BETWEEN A SECONDARY STORAGE DEVICE AND THE PROGRAMMABLE LOGIC RESOURCES

(75) Inventors: Stephen J. Smith, Los Gatos, CA (US); Timothy J. Southgate, Woodside, CA (US)

(73) Assignee: Altera Corporation, San Jose, CA (US)

(21) Appl. No.: 12/322,325

(22) Filed: Jan. 30, 2009

Related U.S. Patent Documents

Reissue of:

(64) Patent No.: 7,171,548
Issued: Jan. 30, 2007
Appl. No.: 10/666,948
Filed: Sep. 19, 2003

U.S. Applications:

(63) Continuation of application No. 09/443,971, filed on Nov. 19, 1999, now Pat. No. 6,658,564.

(60) Provisional application No. 60/109,142, filed on Nov. 20, 1998.

(51) Int. Cl.
*G06F 9/00* (2006.01)
*G06F 3/00* (2006.01)

(52) U.S. Cl. ..... 713/1; 713/100; 710/8

(58) Field of Classification Search ..... 713/1
See application file for complete search history.

(56) References Cited

U.S. PATENT DOCUMENTS

| | | | | |
|---|---|---|---|---|
| 5,068,823 | A | 11/1991 | Robinson | |
| 5,128,871 | A * | 7/1992 | Schmitz | 716/17 |
| 5,134,884 | A | 8/1992 | Anderson | |
| 5,142,625 | A * | 8/1992 | Nakai | 710/260 |
| 5,442,792 | A | 8/1995 | Chun | |
| 5,469,003 | A | 11/1995 | Kean | |
| 5,535,342 | A | 7/1996 | Taylor | |
| 5,535,406 | A * | 7/1996 | Kolchinsky | 712/10 |
| 5,541,849 | A | 7/1996 | Rostoker et al. | |
| 5,548,228 | A | 8/1996 | Madurawe | |

(Continued)

FOREIGN PATENT DOCUMENTS

EP 0 419 105 3/1991

(Continued)

OTHER PUBLICATIONS

Stroy et al. "Inter-Domain Movement of Functionality as a Repartitioning Strategy for Hardward/Software Co-Design" Journal of Systems Architecture, Elsevier Science Publishers BV., Amsterdam, NL, vol. 43, No. 1/05, pgs. 87-98 Mar. 1, 1997 X000679758.

(Continued)

*Primary Examiner* — Suresh K Suryawanshi
(74) *Attorney, Agent, or Firm* — Ropes & Gray LLP

(57) ABSTRACT

A reconfigurable computer system based on programmable logic is provided. A system design language may be used to write applications. The applications may be automatically partitioned into software components and programmable logic resource components. A virtual computer operating system may be provided to schedule and allocate system resources. The virtual computer operating system may include a virtual logic manager that may increase the capabilities of programmable logic resources in the system.

20 Claims, 8 Drawing Sheets

U.S. PATENT DOCUMENTS

| | | | | | |
|---|---|---|---|---|---|
| 5,579,530 | A | * | 11/1996 | Solomon et al. | 710/35 |
| 5,684,980 | A | | 11/1997 | Casselman | |
| 5,705,938 | A | * | 1/1998 | Kean | 326/39 |
| 5,761,484 | A | * | 6/1998 | Agarwal et al. | 716/16 |
| 5,819,064 | A | | 10/1998 | Razdan et al. | |
| 5,822,570 | A | | 10/1998 | Lacey | |
| 5,835,734 | A | | 11/1998 | Alkalaj et al. | |
| 5,859,878 | A | * | 1/1999 | Phillips et al. | 375/316 |
| 5,946,219 | A | * | 8/1999 | Mason et al. | 716/16 |
| 5,966,534 | A | | 10/1999 | Cooke et al. | |
| 5,968,161 | A | * | 10/1999 | Southgate | 712/37 |
| 5,999,990 | A | * | 12/1999 | Sharrit et al. | 710/8 |
| 6,011,740 | A | * | 1/2000 | Trimberger | 365/221 |
| 6,044,211 | A | | 3/2000 | Jain | |
| 6,068,823 | A | * | 5/2000 | Sanchez et al. | 423/235 |
| 6,085,317 | A | * | 7/2000 | Smith | 713/1 |
| 6,219,149 | B1 | | 4/2001 | Kawata et al. | |
| 6,219,628 | B1 | | 4/2001 | Kodosky et al. | |
| 6,219,785 | B1 | * | 4/2001 | Smith | 713/1 |
| 6,226,776 | B1 | | 5/2001 | Panchul et al. | |
| 6,282,627 | B1 | * | 8/2001 | Wong et al. | 712/15 |
| 6,457,173 | B1 | | 9/2002 | Gupta et al. | |
| 6,477,683 | B1 | | 11/2002 | Killian et al. | |
| 6,510,546 | B1 | * | 1/2003 | Blodget | 716/16 |
| 6,608,638 | B1 | | 8/2003 | Kodosky et al. | |
| 6,625,797 | B1 | | 9/2003 | Edwards et al. | |
| 6,658,564 | B1 | | 12/2003 | Smith et al. | |
| 6,745,160 | B1 | | 6/2004 | Gupta et al. | |
| 2002/0100032 | A1 | | 7/2002 | Metzgen | |
| 2002/0124238 | A1 | | 9/2002 | Metzgen | |

FOREIGN PATENT DOCUMENTS

| | | | | |
|---|---|---|---|---|
| EP | 0 419 105 | A2 | | 3/1991 |
| EP | 419105 | A2 | * | 3/1991 |
| EP | 0 445 913 | | | 9/1991 |
| EP | 0 445 913 | A2 | | 9/1991 |
| EP | 0 759 662 | | | 2/1997 |
| EP | 0 759 662 | A2 | | 2/1997 |
| EP | 0 801 351 | A2 | | 10/1997 |
| EP | 0 801351 | | | 10/1997 |
| EP | 801351 | A2 | * | 10/1997 |
| EP | 0 829 812 | | | 3/1998 |
| EP | 0 829 812 | A2 | | 3/1998 |
| GB | 1 444 084 | | | 7/1976 |
| JP | 03-214370 | | | 9/1991 |
| JP | 08-305547 | | | 11/1996 |
| JP | 09-218781 | | | 8/1997 |
| JP | 10-171645 | | | 6/1998 |
| WO | WO 94/10627 | | | 5/1994 |
| WO | WO 97/09930 | | | 3/1997 |
| WO | WO 97/13209 | | | 4/1997 |
| WO | WO 98/031102 | | | 7/1998 |
| WO | WO 00/31652 | | | 6/2000 |
| WO | WO 00/38087 | | | 6/2000 |
| WO | WO 00/63719 | | | 10/2000 |

OTHER PUBLICATIONS

Edwards et al. "Acceleration of Software Algorithms Using Hardware/Software Co-Design Techniques" Journal of Systems Architecture, Elsevier Science Publishers BV., Amsterdam, NL>, vol. 42, No. 9/10, pgs. 697-707, XP000643485.

Edwards et al. "Hardware/software partitioning for performance enhancement" pgs. 2-5, Jan. 1, 1995, XP006529055.

Ernst et al. "The Cosyma Environment for Hardware/Software Cosynthesis of Small Embedded Systems" Microprocessors and Microsystems, IPC Business Press Ltd. London, GB vol. 20, No. 3 May 1, 1996 pp. 159-166, XP000590927.

Parkinson et al. "Profiling in the ASP Codesign environment" Systems Synthesis, 1995, Proceedings of the Eighth International Symposium on Cannes, France Sep. 13-15, 1995, Los Alamitos, CA, USA, IEEE pp. 128-133, XP010192178.

M Wazlowski et al., "Prism-II Complier and Architecture," IEEE, 1993, pp. 9-16.

David Wo et al., "Compiling to the gate Level for a Reconfigurable Co-Processor," IEEE, 1994, pp. 147-154.

Christian Iseli et al., "A C++ compiler for FPFA custom execution units synthesis," IEEE, 1995, pp. 173-179.

Ian Page, "Constructing Hardware-Software Systems from a Single Description," Journal of VLSI Signal Processing, vol. 12, No. 1, Jan. 1996, pp. 87-107.

M.D. Edwards, J. Forrest—"Software acceleration using programmable hardware devices," Jan. 1996, p. 55-63.

Tsuyoshi Isshiki et al., "Bit-Serial Pipeline Synthesis aand Layout for Large-Scale Configurable Systems," IEEE, 1997, pp. 441-446.

Michael J. Wirthlin and Brad L. Hutchings—"Improving Functional Density Using Run-Time Circuit Reconfiguration," Jun. 1998, p. 247-256.

Electronik, De, Franzis Verlag GmbH—"MIT Programmierbarer Logik Verheirated," Mar. 31, 1998, vol. 47, No. 7, p. 38.

Bernardo Kastrup et al., "ConCISe: A Complier-Driven CPLD-Based Instruction Set Accelerator," IEEE, 1999, pp. 92-101.

"List of FPGA-based Computing Machines," Steve Guccione, <http://www.io.com/.about.guccione//HW.sub.--list.html>, Last updated Mar. 31, 1999.

Timothy J. Callahan et al., "The Garp Architecture and C Complier," IEEE, Apr. 2000 pp. 62-69.

IBM, "Programmable Manual Cable Assembly Board," IBM Technical Disclosure Bulletin, vol. 31, No. 12, May 1989, pp. 306-309.

Nanya, "Asynchronous VLSI System Design," ASP-DAC '98 Tutorials, Feb. 10, 1998, Yokohama, Japan.

Nanya et al. "Scalable-Delay-Insensitive Design: a high-performance approach to dependable asynchronous systems," Proceedings of International Symposium on Future of Intellectual Integrated Electronics, Mar. 1999, pp. 1-10.

Tsukasa Yamauchi et al., "SOP: A Reconfigurable Massively Parallel System and Its Control-Data-Flow based Compiling Method," NEC Laboratory, pp. 148-156, IEEE 1996.

Luc Séméria et al., "SpC; Synthesis of Pointers in C Application of Pointer Analysis to the Behavioral Synthesis from C," 1998, pp. 340-346.

João M.P. Cardoso et al., "Marco-Based Hardware Compilation of Java™ Bytecodes into a Dynamic Reconfigurable Computing System," IEEE, 1999, pp. 2-11.

* cited by examiner

METHOD FOR MANAGING RESOURCES IN A RECONFIGURABLE COMPUTER HAVING PROGRAMMABLE LOGIC RESOURCES WHERE AUTOMATICALLY SWAPPING CONFIGURATION DATA BETWEEN A SECONDARY STORAGE DEVICE AND THE PROGRAMMABLE LOGIC RESOURCES

Matter enclosed in heavy brackets [ ] appears in the original patent but forms no part of this reissue specification; matter printed in italics indicates the additions made by reissue.

This application is a continuation of U.S. patent application Ser. No. 09/443,971, filed Nov. 19, 1999, now U.S. Pat. No. 6,658,564, which claims the benefit of U.S. provisional patent application No. 60/109,142, filed Nov. 20, 1998.

BACKGROUND OF THE INVENTION

This invention relates to programmable logic device technology, and more particularly, to computer systems in which programmable logic is reconfigured to optimize the ability of the system to handle a given application.

The only programmable element in a conventional computer architecture is the microprocessor. The microprocessor is manufactured with a fixed instruction set that cannot be customized for specific applications. The microprocessor is flexible in that it can run virtually any software-implemented function of an application. The speed of execution of a given function, however, is generally substantially slower when implemented to execute on a microprocessor. This is because software-implemented functions must be fairly complex to accommodate the microprocessor's generic instruction set.

With conventional computer architectures, software will typically only run on a limited range of platforms. If an application engineer decides to write an application to be run on a given microprocessor, the instruction set the application engineer may use is limited to the one permanently resident on the microprocessor. The application engineer must therefore select whether an application is better suited for a hardware platform or a software platform. Although software platforms are often preferred due to the inflexibility and inefficiency of hardware-based systems, in many cases, the generic instruction set resident on a microprocessor results in inadequate performance for a particular type of software application. For example, graphics-intensive applications usually require hardware that is specifically suited for the particular graphical elements of the application, such as 3-D rendering. In order to circumvent the difficulties associated with programming for a hardware platform, engineers turn to software, which in many cases greatly reduces the application's speed.

Recently, the notion of a reconfigurable computer based on programmable logic devices has been proposed. The goal of a reconfigurable computer is to increase performance over a conventional computer by providing parallelism and rapid execution times through the use of customizable hardware. Increased flexibility can be achieved by using programmable logic devices, because the logic of such devices may be reconfigured by loading new configuration data into the devices. This allows the reconfigurable computer to provide a large number of instruction sets, rather than a single instruction set for a conventional computer. A greater number of functions may be provided using a fixed amount of hardware if the computer uses reconfigurable logic.

It is an object of the present invention to provide improved reconfigurable computers based on programmable logic devices that may be reprogrammed to optimize the ability of the computer to handle a given application.

SUMMARY OF THE INVENTION

This and other objects of the invention are accomplished in accordance with the principles of the present invention by providing a reconfigurable computer system based on programmable logic.

An application engineer developing an application for the reconfigurable computer need not be concerned with the details of which resources are available on that computer. A hardware abstraction is used that is based on the size of a single programmable logic device or a subset of a programmable logic device. When an application is compiled, the functions of the application that are implemented in hardware are partitioned into blocks containing configuration data that are the same size as a programmable logic device or smaller.

The reconfigurable computer system is modular and scalable. If more hardware resources are added, system performance increases. It is not necessary to recompile the application to obtain the benefit of the increased performance.

The reconfigurable computer system allows both hardware and software implementations of a function to exist simultaneously during run-time. A virtual computer operating system is used to select which implementation to run depending on the resources that are available at run-time. Software development tools may be provided that allow an application engineer to use a high-level language to develop both a hardware implementation and a software implementation for an application that may be executed on a reconfigurable computer system using programmable logic resources. These tools may include a partitioner that automatically partitions a specification written in a system design language made up of functions and constraints into software functions and hardware functions. The software functions and hardware functions may be compiled into threads and programmable logic resource configuration data, respectively. The threads and configuration data may be used by the virtual computer operating system at run-time to execute the application.

The reconfigurable computer system provides mechanisms for an application engineer to specify performance requirements for an application. For example, a graphics application may require a particular throughput in terms of the number of polygons that may drawn on a display screen per unit time. If it is required that a million polygons be drawn per second, for example, the application engineer may specify to the virtual computer operating system that the function that draws the polygon must complete its operation in one microsecond.

The virtual computer operating system has the capability to monitor the performance of applications (as well as their individual functions) running within the system and has the capability to reallocate more resources to a particular application or to an individual function to ensure that it meets its performance requirements. The virtual computer operating system may also determine whether to execute the software version or the hardware version of a particular function depending on the performance of the system at the time the function is to be executed. For example, if the polygon drawing function is scheduled to execute at the same time as another computationally intensive application is executing, the dynamic profiling being performed by the virtual computer operating system may take this into consideration when determining resource allocation and whether to use the software version of the polygon drawing function or the hardware version of the polygon drawing function.

A virtual computer operating system is provided that allocates the functions of the application among the programmable logic resources. The virtual computer operating system may include a virtual computer kernel services component. The virtual computer kernel services component may include various resource managers including a virtual logic resource manager.

During run-time, if a particular reconfigurable computer system has a virtual operating system with virtual logic capabilities, the virtual logic manager may control the swapping of programmable logic configuration data and application state information between programmable logic resources and a secondary storage device. This allows reconfigurable computer systems with limited resources to implement complex applications.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
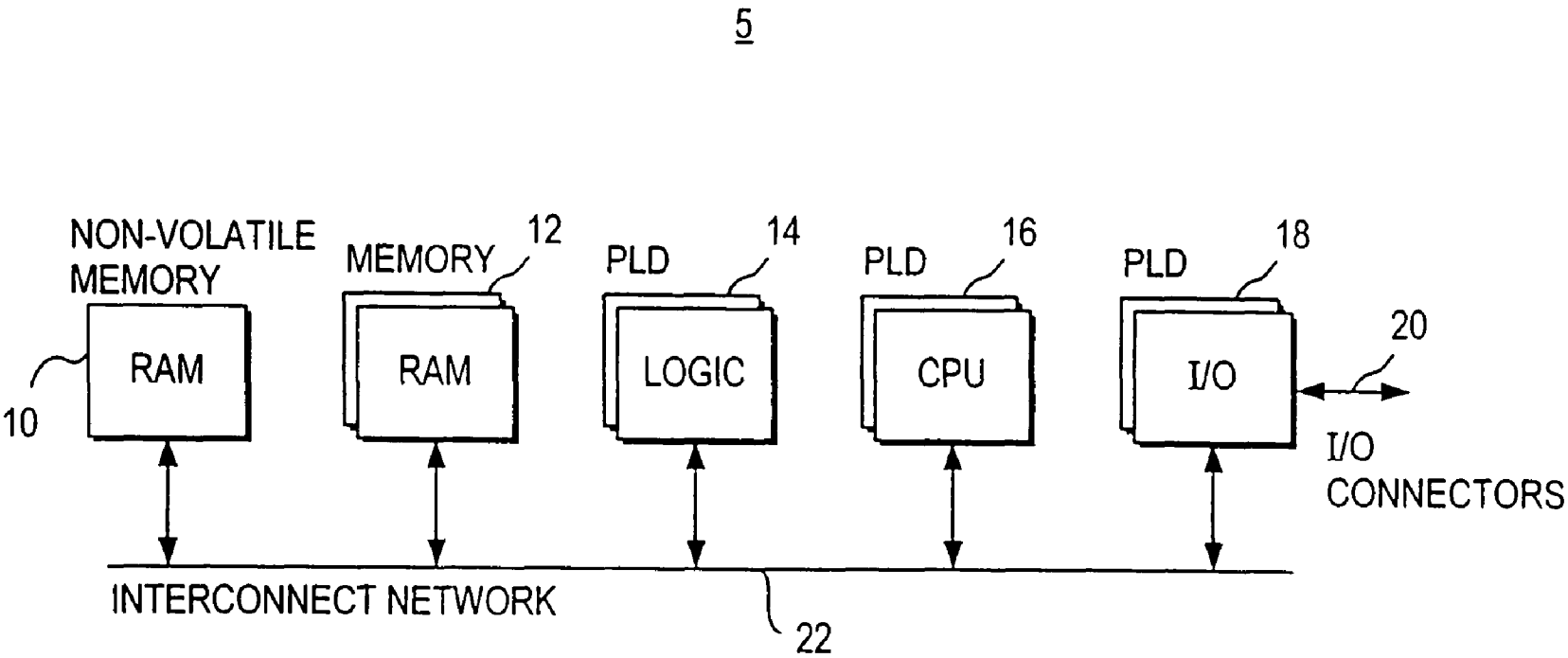
FIG. 1 is a block diagram of an illustrative reconfigurable computer system in accordance with the present invention.

A schematic diagram showing a high-level view of an illustrative reconfigurable computer system in accordance with the present invention is shown in FIG. 1. The hardware resources in reconfigurable computer system 5 include a central processing unit (CPU) 16, which may be implemented in a programmable logic device, an actual microprocessor, or a combination of such elements, a memory 12, input/output (I/O) devices 18 (which may be based on a programmable logic device or other suitable device), and an interconnect network 22.

A programmable logic device typically includes an array of programmable logic regions, a routing structure, input and output regions, memory regions and a configuration store (i.e., memory for storing the configuration data that is used to configure the logic components in the programmable logic regions). The logical functions performed by a programmable logic device are determined by the configuration data stored in the configuration store and the connection of the configuration store to the logic regions, the routing structure, the input and output regions, and the memory regions. The configuration store may be based, for example, on static random-access memory which may be written to, in-circuit, an essentially unlimited number of times. Alternatively, a device, such as an erasable programmable read-only memory device, external to the programmable logic device may be used as a configuration store in place of the internal static random access memory of the programmable logic device. Any other memory or storage device that is capable of being written to a substantial number of times may be used if desired. The logical function performed by a programmable logic device may therefore be modified in-circuit numerous times. An example of a suitable programmable logic device is the FLEX EPF10K50 device from Altera Corporation of San Jose, Calif. This type of programmable logic device is merely illustrative. Any other suitable type of programmable logic device may be used in system 5 if desired. If desired, programmable logic devices may support partial reconfiguration of the configuration store or multiple configuration stores.

Non-volatile random access memory 10 may be used to store initialization information. When power is first applied to a reconfigurable computer system, the initialization information may be used to initialize the computer. This process is known as "boot-strapping."

The memory devices used for computation may be random-access memory devices 12. These may be formed from static or dynamic integrated circuit memory technology. The choice of static or dynamic memory technology may be made based on the desired computational function to be performed by the memory device. Static random-access memory devices have faster access times than dynamic random-access memory but use more transistors per storage cell, and are therefore more expensive to manufacture for an equivalent storage density. The combination of access time, density and cost are factors in determining the preferred memory technology for a given computational function.

The interconnect network 22 may be formed by wires (e.g., a bus) connecting each of the physical resources together. The interconnect network topology may also be formed using programmable logic devices or using programmable interconnect devices which may allow the topology to be dynamically reconfigured. The topology may then be optimized for a particular computational function. Examples of potential network topologies are mesh, full or partial crossbar, cliques, hyper-cubes, and distributed or shared memory hierarchies.

The I/O connections 20 may be formed by wires coupling the reconfigurable computing array to external devices such as a keyboard, a visual display, mass storage devices such as a hard disk drive, or to a computer network comprising other reconfigurable, or non-reconfigurable, computer systems.

If desired, programmable logic devices may be used to implement combinatorial or sequential logic functions for logic device 14, microprocessor functions for microprocessor 16, or I/O functions for I/O interface 18. Some of these functions, such as the microprocessor functions, may be implemented in fixed-hardware, if desired.

The expansion of such a system may involve the addition of more programmable logic devices. As programmable logic devices are added to the system, the processing power increases. Scalability and modularity allow an increase in the programmable logic device resources to result in an increase in the performance of the system.

Memory 12 may support a memory hierarchy for executing applications and system programs and data. Applications and system programs may include microprocessor code and programmable logic device configuration data.

A programmable logic device may be configured to form an application-specific I/O device 18 which may be required only for the duration of the application. These devices may use protocols such as Ethernet protocols, small computer systems interface (SCSI) protocols, peripheral component interconnect (PCI) protocols, video driver protocols, etc.

The interconnect network 22 may be used to provide the following functions: a programmable logic device configuration bus, an application memory bus and an I/O bus. Each bus may function independently. The programmable logic device configuration bus may be used to configure each programmable logic device in the system. Depending upon the programmable logic device configuration addressing mode, this data may be simultaneously broadcast to a group of programmable logic devices or to an individual programmable logic device. The application memory bus may allow the system to form a shared or distributed memory system with the array of programmable logic devices. The I/O bus may connect a programmable logic device to an external I/O device.

Figure 2:
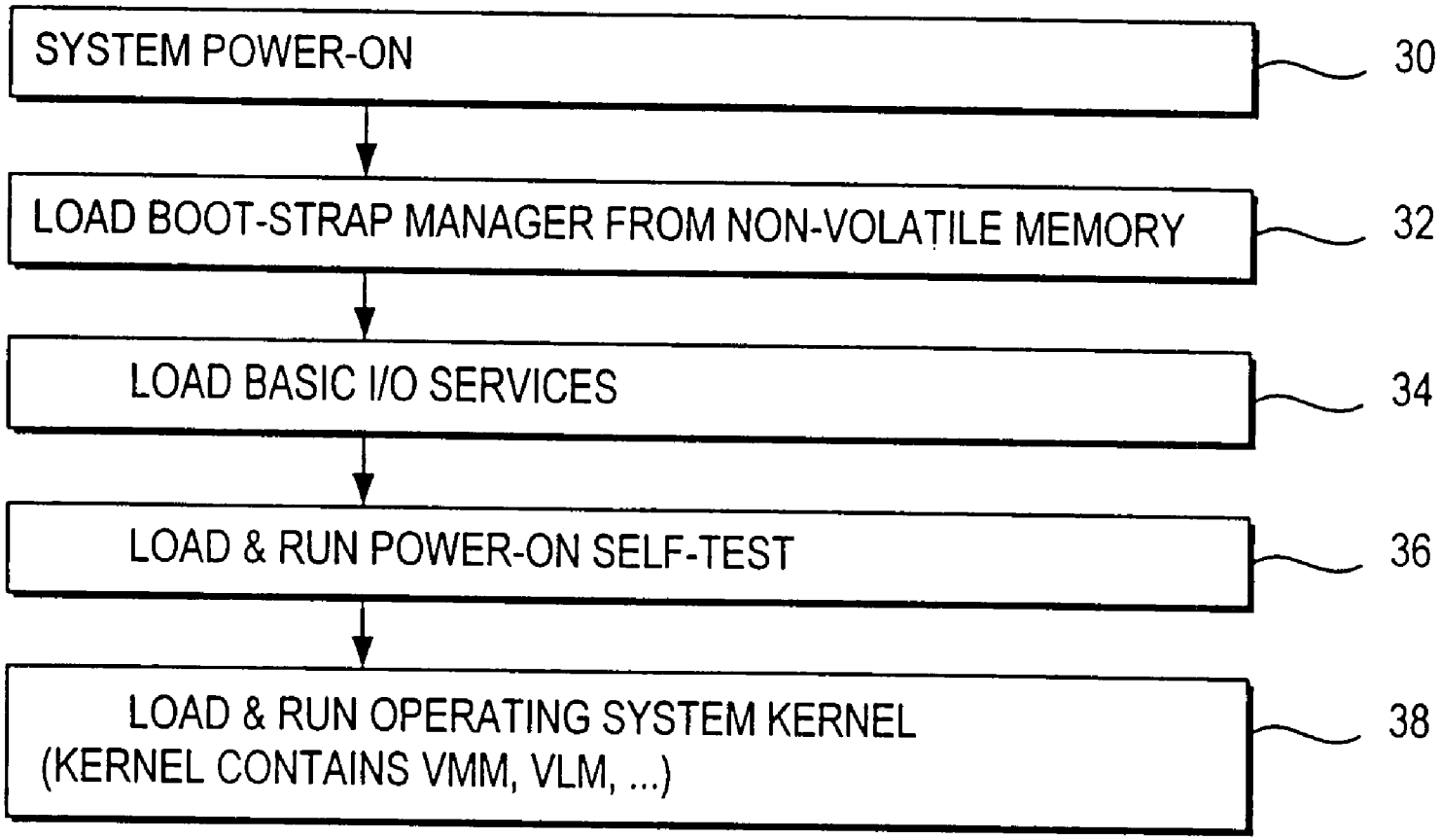
FIG. 2 is a flow chart of illustrative steps involved in the boot process of a reconfigurable computer in accordance with the present invention.

The information in the non-volatile memory device 10 may be used to boot-strap the system as shown in FIG. 2. When power is first applied to the system in step 30, neither the programmable logic devices nor the random access memory 12 used for computation retain information from previous configurations. The purpose of the information stored in the non-volatile memory 10 is to load a boot-strap manager (step 32). The boot-strap manager may, in turn, load basic I/O services (BIOS) in step 34, load and run a power-on self-test diagnostic program in step 36, and load and run an operating system kernel in step 38.

The boot-strap instructions stored in the non-volatile memory 10 may be executed on a computational resource during step 36. This resource may be a dedicated microprocessor, a programmable logic device configured as a microprocessor, a combination of a microprocessor and a programmable logic device partially configured as a microprocessor, or a programmable logic device logic circuit. If the resource is a dedicated microprocessor, the non-volatile memory 10 will simply contain the microprocessor instructions required to complete the boot-strap process. If a programmable logic device needs to be configured as a microprocessor, then the non-volatile memory 10 may contain programmable logic device configuration data and microprocessor instructions. Otherwise, the non-volatile memory 10 may contain programmable logic device configuration data for a logic circuit which may or may not require additional program instructions to complete the boot-strap process.

The final boot-strap process is to load an operating system kernel. The loading process may involve loading instructions for a microprocessor implemented using a programmable logic device, or may involve loading the configuration data for a programmable logic device. Whichever arrangement used—microprocessor and instructions or logic circuit with or without instructions—the operating system may be referred to as the virtual computer operating system (VC-OS).

Figure 3:
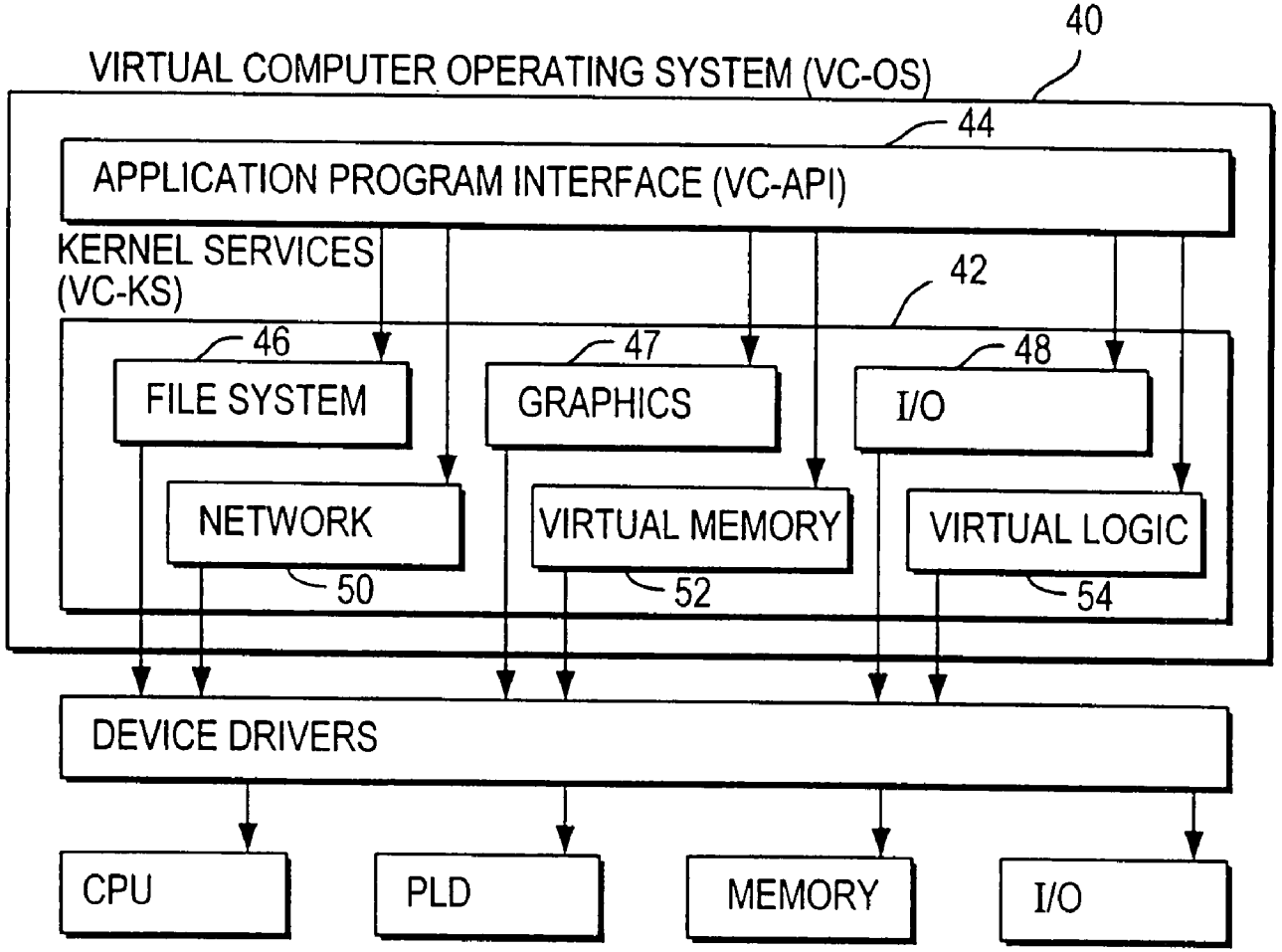
FIG. 3 is a block diagram of illustrative operating system kernel services for a reconfigurable computer in accordance with the present invention.

Illustrative components of the virtual computer operating system are shown in FIG. 3. The virtual computer operating system 40 of FIG. 3 may provide the basic services that traditional operating systems offer in terms of run-time management. In addition the virtual computer operating system supports services for system 5 related to using programmable logic resources.

The virtual computer operating system includes run-time management tools that ensure that the functions of a given application can be executed. For example, the run-time management functions ensure that functions and timing constraints specified at the system design level are satisfied.

Conventional operating systems such as Microsoft Windows NT schedule functions to be executed on the available resources in conventional computer systems at run-time. The resources in such a conventional computer system are allocated dynamically at run-time depending upon application program requirements and resource availability. Each resource has a resource manager, such as a virtual memory manager which is responsible for the allocation of physical memory. The most common resource managers in conventional operating systems are a file system manager, a graphics manager, an I/O manager (to handle mass storage access or simple I/O devices such as a keyboard or mouse), a network manager, and a virtual memory manager.

In accordance with the present invention, virtual computer operating system 40 includes an application program interface 44 that provides an interface between the virtual computer operating system 40 and applications written for the virtual computer operating system 40. Virtual computer operating system 40 also includes kernel services 42 that provide resource management functions. Each resource in the system may have a resource manager. For example, file resources may be handled by file system manager 46. Graphics resources may be handled by graphics manager 47, I/O resources may be handled by I/O manager 48, network resources may be handled by network manager 50, and virtual memory resources may be handled by virtual memory manager 52. A reconfigurable computer system may have virtual logic, which may be managed by a virtual logic manager 54 that handles requests that are made by applications to access the limited programmable logic resources in system 5.

Conventional operating systems rely on virtual memory to overcome limited random-access memory constraints. Virtual memory may use secondary storage devices (such as hard-drives) to temporarily handle run-time data that would otherwise typically be stored in a primary storage device (such as random-access memory). As functions and data are requested by an application, the operating system determines whether the requested data is currently stored in virtual memory, and if it is, replaces the data in the physical memory for other applications with the functions and data currently being requested from virtual memory.

The virtual logic manager of the present invention, however, is responsible for the run-time allocation of programmable logic devices. The virtual logic manager satisfies the run-time requirements of various applications' requests for functions that are to be implemented in programmable logic. An application may request that more functions be implemented using programmable logic devices than there are programmable logic devices to handle such requests. The virtual logic manager must therefore manage the run-time swapping of functions to be implemented in programmable logic.

Conventional virtual memory managers make a relatively small amount of physical memory appear to an application as a relative large amount of logical memory. This is achieved by the run-time swapping of memory pages in and out of physical memory to and from a secondary storage (usually a local hard disk drive). With virtual logic manager 54 of the present invention, a relatively small amount of physical programmable logic devices may be made to appear to an application as a relative large amount of logical programmable logic devices. This is achieved by using virtual logic manager 54 to perform run-time swapping of programmable logic device configuration data and state information in and out of programmable logic device configuration memory (i.e., the configuration store) to and from a secondary storage device (usually a local hard disk drive).

Figure 4:
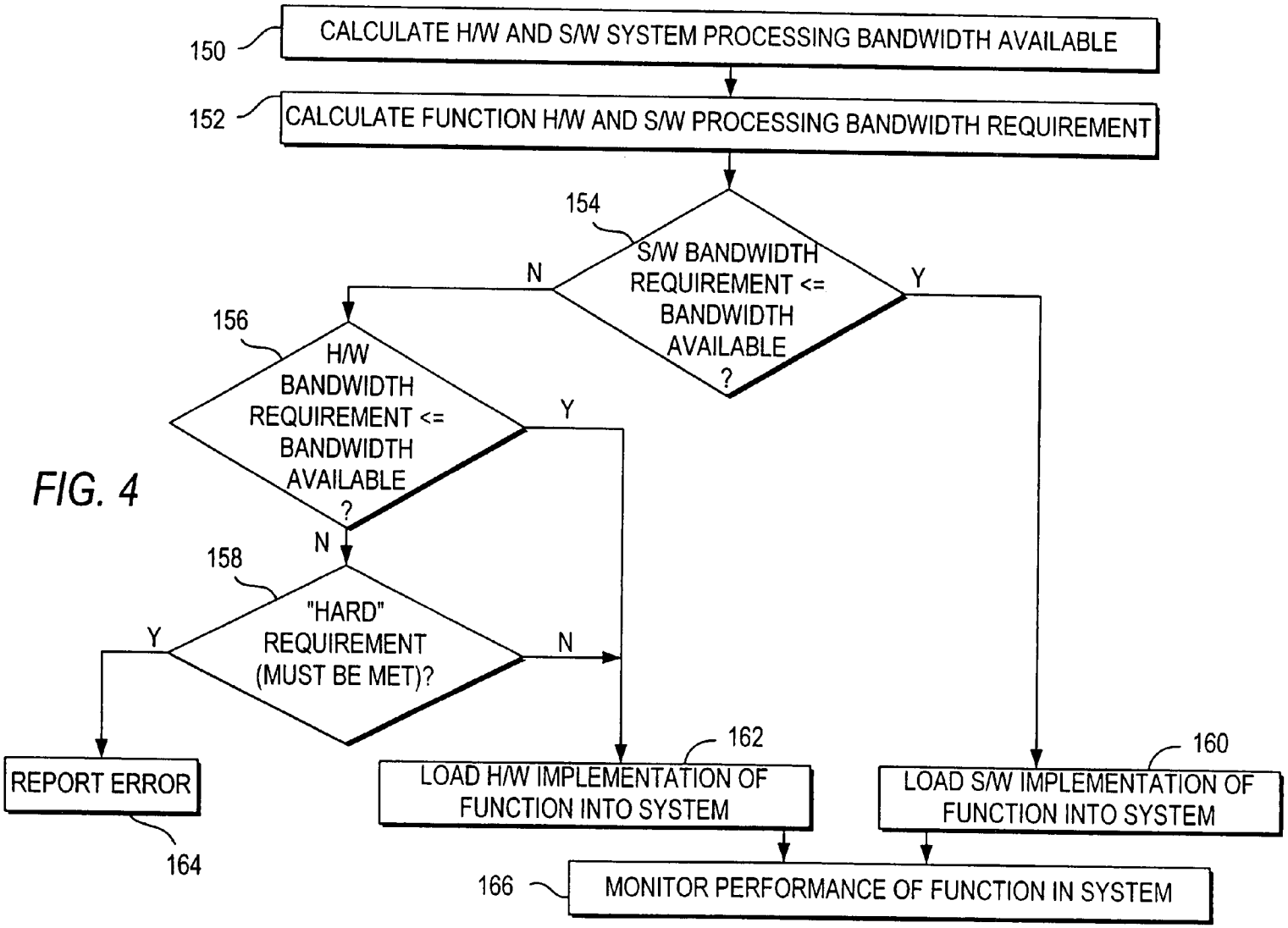
FIG. 4 is a flow chart of illustrative steps used by the virtual computer operating system to load a function into a reconfigurable computer in accordance with the present invention.

The process of loading a function for execution in the system is shown in FIG. 4. This process is used to select the best implementation of the function (either software or hardware) to be used at the time the function is executed.

The available hardware processing bandwidth of the system and the available software processing bandwidth of the system is determined at step 150. The software processing bandwidth may be calculated from the amount of time all of the microprocessors in the system are idle and are not executing functions. The hardware processing bandwidth may be calculated on the basis of the number of unused programmable logic resources in the system along with the amount of time the used programmable logic resources are not processing data.

The required hardware processing bandwidth for the function and the required software processing bandwidth for the function are determined at step 152. These requirements may be specified by the application engineer as an absolute requirement or it may be specified based on the performance of the system when executing a small additional function supplied alongside the function to be executed. This small function may be executed at step 152 and the system's performance may be measured.

At step 154, it is determined whether the required software processing bandwidth is less than the bandwidth available in the system. If the required software processing bandwidth is less than the bandwidth available in the system, then the software implementation is loaded onto the system to be run on a microprocessor at step 160. This choice is made because the software implementation will use less system resources than the hardware implementation.

If the software processing bandwidth is not adequate then the hardware implementation is evaluated at step 156. If the available hardware bandwidth is acceptable, then the function is loaded onto the system to be executed directly on a programmable logic resource at step 162. If it was determined at step 156 that the available hardware bandwidth is not acceptable, and further determined at step 158 that the performance requirement was "hard," meaning the performance requirement must be satisfied, then an error message is reported to the user and the loading of the function (and it's parent application) must be abandoned at step 164. If the requirement was not "hard," then the function is loaded anyway at step 162 and runs at a reduced performance level.

After either implementation of a function has been loaded into the system (using normal means for determining which functions are of lower priority and unloading these lower priority functions if necessary), the performance of the function in the system is monitored at step 166. The priority given to the function for system processing bandwidth will be proportional to the differences between the required bandwidth and the actual bandwidth being realized.

Whenever a new function is scheduled for resource allocation by the priority management process, the first step taken by the resource allocation routine of the virtual computer operating system is to determine whether a resource exists that can satisfy the constraints of the function. If such a resource exists, then the resource is allocated to the function. If not, a suitable candidate must be found from the existing pool of physical resources using a suitable replacement policy. For example, if it is determined that there are insufficient programmable logic resources available to be reconfigured to perform a given function of an application, the virtual computer operating system may be used to ensure that the given function is implemented using hardware resources that do not need to be reconfigured (e.g., a dedicated microprocessor or a programmable logic device configured to perform as a CPU). The virtual computer operating system may ensure that a suitable software version of the function was provided by the application engineer before attempting to run the function on a microprocessor.

Subject to function constraints, suitable replacement policies which may be used include first-in-first-out, least-recently-used, or least-frequently-used. An extreme case might be an on-demand swap of the first suitable resource when the run-time management system detects a high priority function such as a real-time interrupt handling process.

With regard to resource allocation and scheduling, run-time resource management by operating systems for conventional computer architectures involves the use of various techniques for CPU scheduling. Having a computer system handle applications (as well as individual functions under the same application) on a one-by-one basis can be extremely inefficient. Depending on the task being processed at any given time, resources can become tied up while other resources are idle. The result is a very slow computer. In response, the concept of CPU scheduling was gradually adopted by most conventional operating systems.

CPU scheduling in conventional computer systems involves allocating resources and scheduling the order in which all functions are processed by the system. The goal of CPU scheduling is to create a stable multitasking environment. This environment is created by algorithmically allocating CPU resources based on a combination of factors such as prioritization, function idleness due to I/O delays, or any other factors that may be used in determining the order in which functions are processed. For example, if a microprocessor is handling a function that reaches a point at which it has to wait for a user input, a conventional operating system's CPU scheduling feature may provide another function with an opportunity to use the microprocessor's resources (as well as other available system resources) until the user input is available. When the user input is available, the first function may regain the resources it had relinquished when it caused an idleness in the system.

In accordance with the present invention, in a reconfigurable computer system where programmable logic devices are either fully or partially configured as one or more microprocessors, the function of a scheduling system takes on a somewhat different role than that of a conventional CPU scheduling system. Whereas conventional CPU scheduling allocates microprocessor resources to functions, programmable logic device scheduling allocates programmable logic resources (of which there may be several) to functions. The programmable logic resources do not necessarily have to be programmed to be a microprocessor, but may be programmed to perform any function desired, such as I/O functions, graphics functions, network functions, etc. The purpose of such a feature in a reconfigurable computer's operating system is to help manage the various tasks being processed simultaneously among a group of programmable logic resources. In a conventional computer's operating system, in contrast, the purpose of a CPU scheduling feature is primarily to reduce microprocessor idleness due to the high demand for processing power by the various tasks being active at any given time.

A typical scheduling system for a reconfigurable computer may use a time-multiplexing system in which programmable logic resources may be allocated to application functions. This may involve switching between different functions at predetermined time intervals. Notable exceptions include real-time interrupts and I/O functions.

If resources become idle in a reconfigurable computer system and no functions are scheduled for immediate allocation, then function prefetching can help to minimize the time cost associated with programmable logic resource configuration overhead as the programmable logic resource can be loaded with the configuration data before the function is required.

This time cost associated with loading a programmable logic device may be on the order of milliseconds with presently available programmable logic devices. If desired, the time required to configure a programmable logic device may be reduced (e.g., to the order of nanoseconds) by using increased pipelining and parallelism on the device.

A reconfigurable computer system based on a group of programmable logic resources therefore has the benefit of having relatively large processing capabilities, because the number of programmable logic resources used in the system may be relatively large. In a reconfigurable system, if more processing power is needed, one simply needs to add more programmable logic devices onto the interconnect network. An application need not necessarily be recompiled after adding more programmable logic devices to the system, because the run-time manager will automatically detect and incorporate the new hardware in the run-time performance specification. All of these devices may then be controlled and kept track of using the virtual computer operating system.

The minimum and maximum function performance goals set by the software designer may determine the next function to be scheduled for resource allocation. In addition, the priorities of the functions currently executing may also be used in the determination of the next function to be scheduled.

Another feature of the present invention is the ability to defragment the programmable logic devices. In conventional computers, storage devices such as hard drives may be defragmented to avoid the problems that occur as resources on the drive are continually allocated and deallocated. A region of deallocated space on a conventional hard drive may not be sufficiently large to be reallocated to a function that requires a larger contiguous space. In accordance with the present invention, programmable logic defragmentation may be used to defragment the partial configuration of a single programmable logic device. This allows many small preallocated areas of programmable logic to be relocated to make a larger working region of programmable logic available. This involves reallocating the configuration data for certain switches to different portions of the programmable logic to accommodate desired programmable logic device functions.

Another aspect of the present invention relates to software development. The software development process is a critical part of using any computing system. It is important to have capabilities for performing complex functions and creating intricate interfaces with which a user may interact with the computing system. Most conventional development tools include high level programming languages such as JAVA, C++, ADA, LISP, COBOL, VISUAL BASIC, as well as others. In order to maintain consistency during the software development process, high level languages for the reconfigurable computer system may be designed using the principles of conventional high-level programming languages.

An application typically includes multiple functions. For example, a graphics-intensive application may use certain functions for rendering surfaces and may use other functions for ray tracing. The virtual computer operating system allocates programmable logic device resources to the functions of the application.

A unit hardware abstraction may be used. That is, an application engineer need not worry about how many programmable logic device resources any particular system running the application has. Rather, an abstraction may be made that all of the resources are available, subject to a minimum resource requirement of at least one programmable logic device.

Figure 5A:
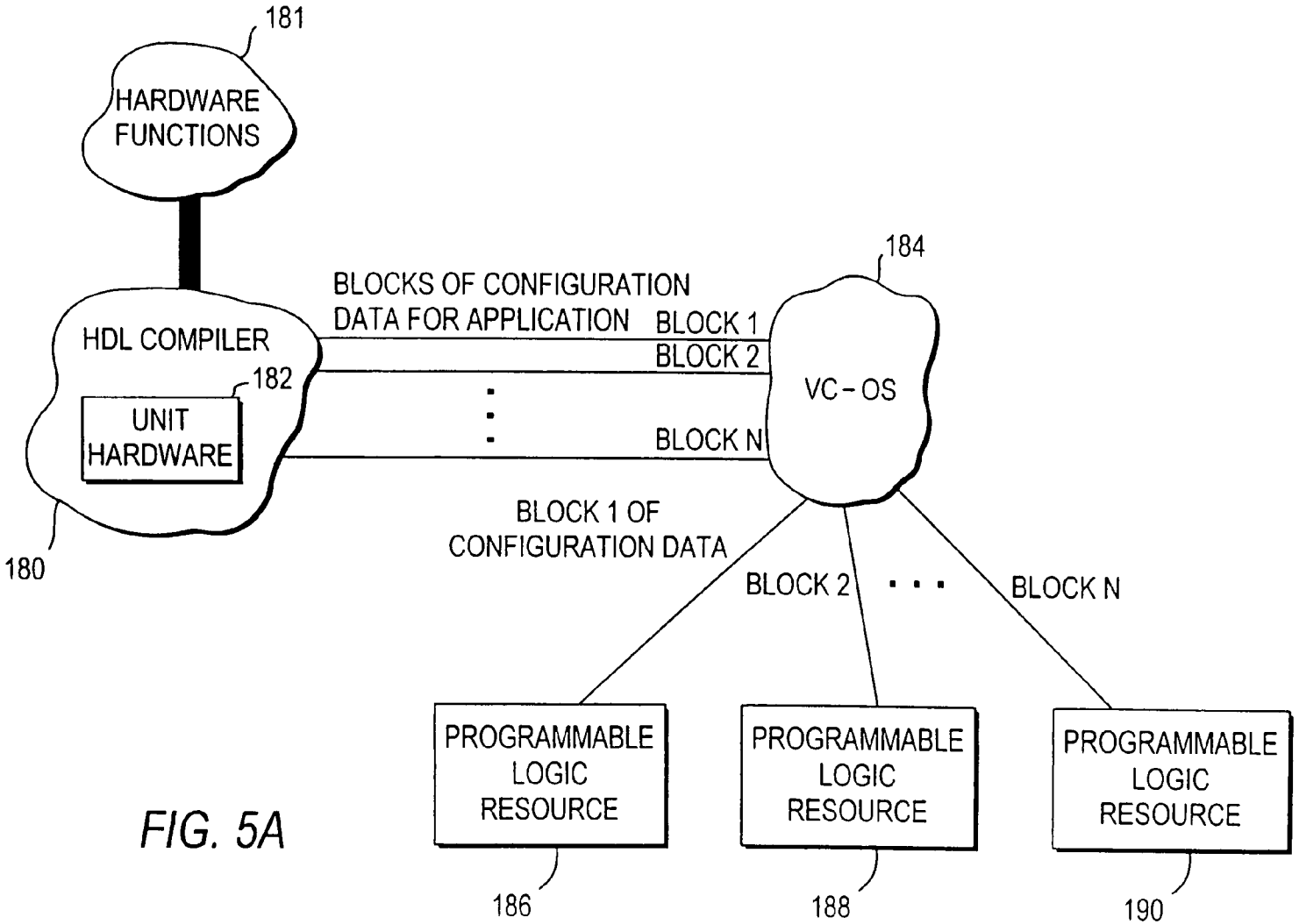
FIG. 5A is a schematic diagram showing how the virtual computer operating system may take an application that is designed for unit hardware and may allocate one or more programmable logic resources in the computer system to the functions of the application in accordance with the present invention.

This is shown in FIG. 5A. Hardware functions 181 are compiled by HDL compiler 180 based on a unit hardware abstraction (i.e., the assumption that the hardware description language for the application is being compiled into blocks of configuration data that will be implemented in one programmable logic resource or a subset of one programmable logic resource, represented as unit of hardware 182). Unit hardware 182 may be, for example, a single programmable logic device or a part of a single programmable logic device. HDL compiler 180 provides VC-OS 184 with configuration data in the form of blocks of configuration data where each block fits into one unit hardware 182. VC-OS 184 allocates programmable logic device resources to the blocks (that make up functions, which in turn, make up the application) as needed.

Figure 5B:
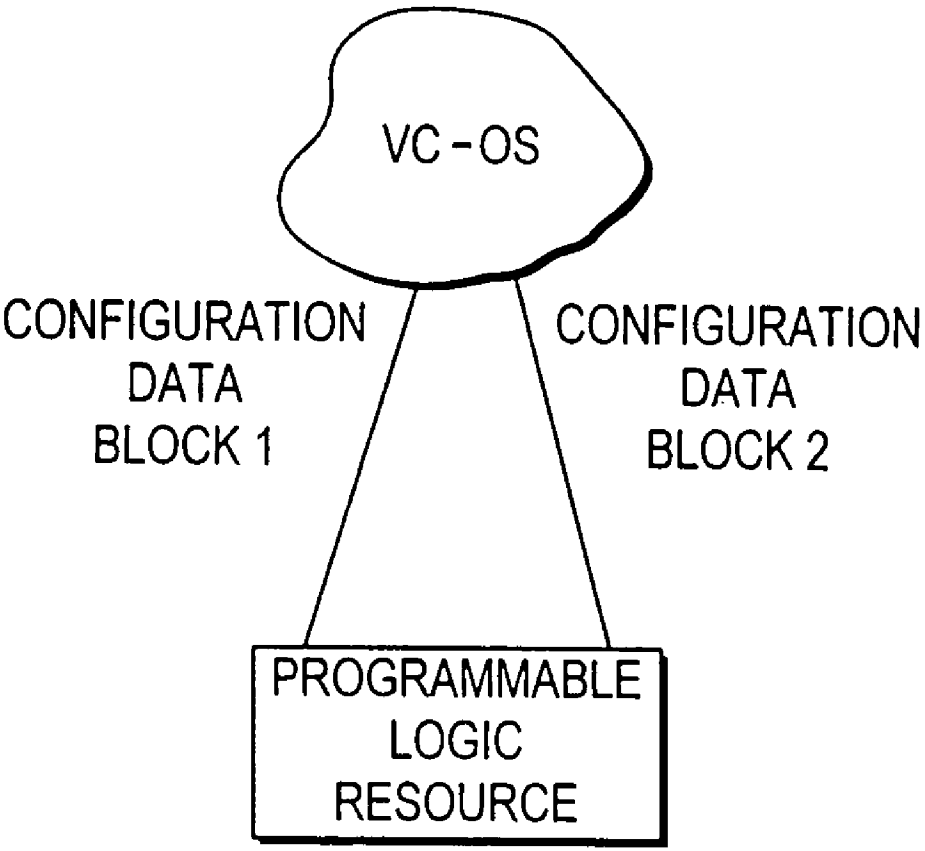
FIG. 5B is a schematic diagram showing how a programmable logic resource may be allocated to multiple functions in accordance with the present invention.

In the example of FIG. 5A, VC-OS 184 has allocated programmable, logic resource 186 to block 1 of the application, has allocated programmable logic resource 188 to block 2 of the application, . . . and has allocated programmable logic resource 190 to block n of the application. Logic resources such as logic resources 186, 188, and 190 may each be based on a single programmable logic device, may each be based on a portion of a programmable logic device, may each be based on a combination of such device arrangements, or may each be based on any other suitable logic resources. HDL compiler 180 may compile applications based on a consistent unit hardware abstraction even though the resources to be allocated may change from system to system or may change at run time in any given system. The virtual logic manager may swap blocks of configuration data in a particular programmable logic resource if such resources are limited. Furthermore, as shown in FIG. 5B, the VC-OS may allocate one programmable logic device resource to multiple blocks of configuration data.

Figure 6:
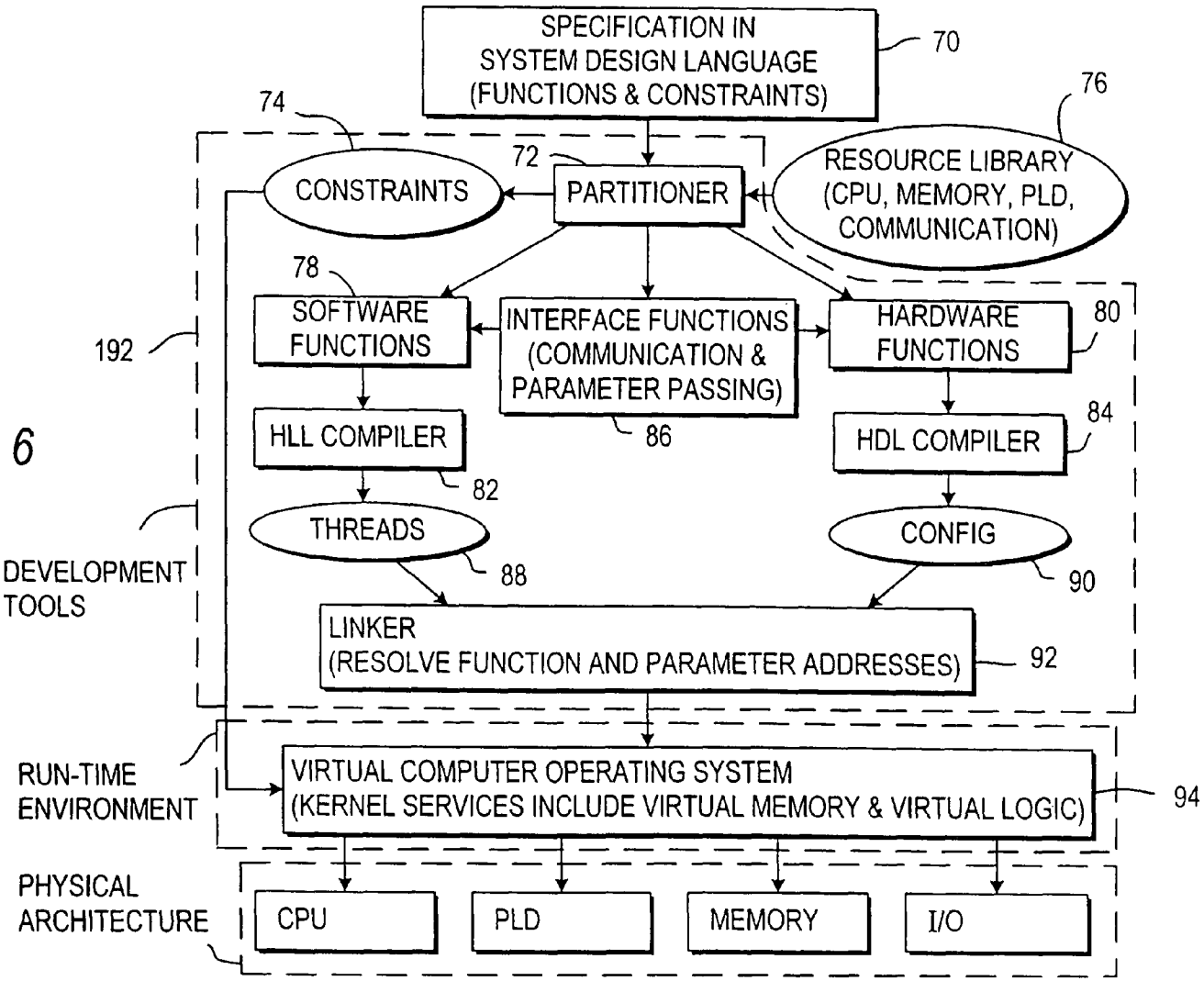
FIG. 6 is a block diagram of an illustrative software development flow for a reconfigurable computer in accordance with the present invention.

The process of compiling a high-level design specification or algorithm and executing it on a reconfigurable hardware architecture is detailed in FIG. 6. A specification (algorithm) 70, a set of constraints 74, and a resource library 76 are provided to software development tools 192 as inputs. The specification may be written in a system design language. In the specification, the application engineer need only write an application using the tools provided by the system design language. The application engineer need not take into account a software version and a hardware version of the functions written in the system design language. A partitioner 72 may then partition the specification 70 into software functions 78 and hardware functions 80. This is done so that the functions may be run entirely in software (e.g., on a microprocessor), run entirely in hardware (on a programmable logic device), or run in a combination of both. Both a software implementation and a hardware implementation may be generated for each functional partition because the decision to run a preferred partition implementation may be delayed until run-time. A system design language profiler may also be run on the system design language code to analyze critical paths and assign partitions.

The partitioning phase may have to take constraints 74 into account. There are two generic types of constraints 74. First, the functional boundaries of the system design language specification 70 may have timing relationships within functions and there may be a concurrent or sequential constraint between functions. Second, cost functions may be associated with using hardware resources in the resource library 76. The resource library 76 contains details about each available hardware resource (generally this includes microprocessors, memory, and programmable logic devices). These can include computation rate, latency, and response time of a resource or cost functions of time (usually for software implementations), area (usually for hardware implementations), or communication (overhead in both time and area).

Constraints may be defined as "hard" constraints that must be met. An example of a hard constraint is a constraint involving a real-time I/O or interrupt process. Constraints may also be defined as "soft" constraints. An example of a soft constraint is a constraint related to arithmetic functions in a spreadsheet. It is not critical that these arithmetic functions get performed within a particular time, but the faster these functions are executed, the more convenient it would be to use the application.

The resource library 76 describes properties for each type of resource. For example, a microprocessor may have properties such as a particular instruction set and a data-path width, a memory may have a particular data-path width, and a programmable logic device may have a particular logic capacity and an I/O count. The partitioning tool 72 takes properties from the resource library 76 and constraints 74 into account, but may not take into account how many resources there are of each resource within a given system. It is the responsibility of the run-time resource managers to map functional partitions into available hardware resources on-demand from an executing application.

Once the system design language specification 70 is partitioned into software functions 78 and hardware functions 80, interface functions 86 may be synthesized to allow parameters to be passed between these functions. These interface functions 86 may be software methods for writing parameters to hardware functions 80 that are memory-mapped, or this could involve instantiating a hard-disk interface circuit into a programmable logic device to enable the archive of a file system.

It is not necessary to have both software and hardware versions of all of the functions. An application engineer may write all functions for both software and hardware, some for both, or strictly for one or the other. It may be desirable, however, to have both versions in order to give the operating system flexibility in choosing an optimal set of functions and implementations.

After partitioning to functions, each component in software and hardware must be mapped into the physical implementation technology. This involves compiling software functions 78 into threads 88 using a high-level language compiler 82 and hardware functions 80 into configuration patterns 90 using a hardware description language compiler 84. Various optimization and reduction techniques may be applied at this stage, such as constant propagation (both arithmetic and geometric), strength reduction (e.g. a+a=2 * a—this would remove a potentially costly multiply stage), pipelining, or resource sharing.

The final executable code image (generated by a linker 92 which resolves software and hardware function and parameter addresses), includes a main function and dynamically-linked functions all of which may be executed in software or hardware or a combination of both. These functions and the constraints 74 generated by the system design language partitioner 72, are inputs to the virtual computer operating system 94.

Figure 7:
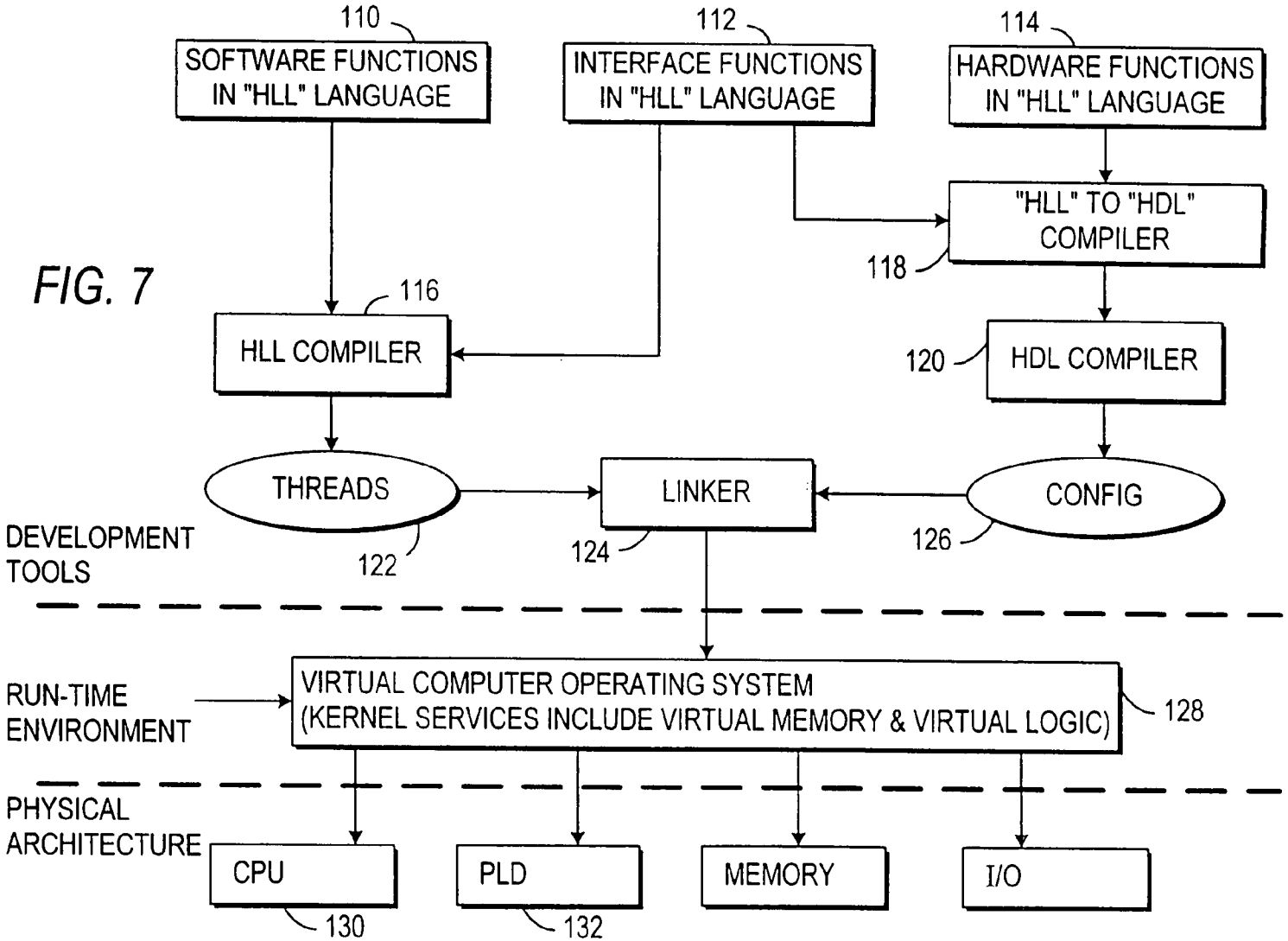
FIG. 7 is a block diagram of an illustrative simplified software development flow for a reconfigurable computer in accordance with the present invention.

Alternatively, a user may simplify the design flow by partitioning the specification manually into software components and hardware components as illustrated in FIG. 7. This flow would assume no functional timing constraints (because it is not written in the system design language). If desired, constraints may be taken into account. The main flow of control may be executed on a microprocessor 130 (or a programmable logic device programmed to be a microprocessor), which may call functions resident in programmable logic 132.

Algorithm functions, targeting either a microprocessor 130 or a programmable logic device 132, may be written in a high-level language 114 and translated to a hardware description language using a high-level language to hardware description language compiler 118 for the functions to be implemented in a programmable logic device 132. Interface functions 112 necessary to pass parameters between the software and hardware functions are also specified in the high-level language.

The high-level language compiler 116 compiles software functions 110 and creates threads 122 that are linked with the configuration data 126 from the hardware description language compiler 120 in the linker 124. These functions may then be used by the virtual computer operating system 128.

Depending on available resources, the application engineer's instructions, and constraints, the virtual computer operating system may determine (either during run-time or during software compilation) whether the software implementation, the hardware implementation, or a combination of both will be used to run a particular application. This allows for extremely efficient processing since functions that are better suited to run on software are run using software, whereas those functions that are better suited for programmable logic device hardware are run using programmable logic resources.

The foregoing is merely illustrative of the principles of this invention and various modifications can be made by those skilled in the art without departing from the scope and spirit of the invention.

What is claimed is:

1. A method for managing resources in a reconfigurable computer that contains programmable logic resources that are reconfigurable to optimize the ability of the computer to handle a given application comprising:

automatically swapping configuration data between a secondary storage device and the programmable logic resources during programmable logic resource allocation using a virtual logic manager, wherein the secondary storage device is a mass storage device.

2. The method defined in claim 1 wherein the reconfigurable computer includes a central processing unit implemented on at least one programmable logic device and programmable logic coupled to the central processing unit, wherein the programmable logic is reconfigurable to optimize the ability of the computer system to handle a given application.

3. The method defined in claim 1 wherein the reconfigurable computer includes a central processing unit implemented on a microprocessor and programmable logic coupled to the central processing unit, wherein the programmable logic is reconfigurable to optimize the ability of the computer system to handle a given application.

4. The method defined in claim 1 wherein the reconfigurable computer includes a central processing unit that is partially implemented on a microprocessor and that is partially implemented on a programmable logic device and programmable logic coupled to the central processing unit, wherein the programmable logic is reconfigurable to optimize the ability of the computer system to handle a given application.

5. The method defined in claim 1 wherein the automatically swapping configuration data between the secondary storage device and the programmable logic resources comprises automatically swapping configuration data between a hard disk drive and the programmable logic resources.

6. The method defined in claim 1 wherein the automatically swapping configuration data between the secondary storage device and the programmable logic resources comprises automatically swapping configuration data between the secondary storage device and programmable logic device configuration memory.

7. The method defined in claim 1 further comprising automatically swapping state information between the secondary storage device and the programmable logic resources during programmable logic resource allocation using the virtual logic manager.

8. The method defined in claim 1 wherein the reconfigurable computer is scalable with respect to the programmable logic resources.

*9. A method for optimizing the ability of a computer comprising programmable logic resources to execute a given application, the method comprising:*

*during run-time of the application, automatically determining an available programmable logic resource bandwidth; and*

*during run-time of the application, based at least in part on the available programmable logic resource bandwidth, automatically swapping configuration data between a memory device and at least one of the programmable logic resources to reconfigure programmable logic resources.*

*10. The method of claim 9 wherein the automatically reconfiguring is performed by a virtual computer operating system.*

*11. A reconfigurable computer system comprising:*

*at least one programmable logic resource;*

*a secondary storage device coupled to the at least one programmable logic resource, wherein the secondary storage device is a mass storage device; and*

*a central processing unit coupled to the at least one programmable logic resource and the secondary storage device, wherein the processor is configured to automatically swap configuration data between the secondary storage device and the at least one programmable logic resource during programmable logic resource allocation using a virtual logic manager.*

*12. The system of claim 11 wherein the central processing unit is at least partially implemented on the at least one programmable logic resource.*

*13. The system of claim 11 wherein the central processing unit is at least partially implemented on a microprocessor.*

*14. The system of claim 11 wherein the central processing unit is partially implemented on a microprocessor and is partially implemented on the at least one programmable logic resource.*

*15. The system of claim 11 wherein the secondary storage device is a hard disk drive.*

*16. The system of claim 11 wherein the at least one programmable logic resource comprises configuration memory, and wherein the configuration data is swapped between the configuration memory and the secondary storage device.*

*17. The system of claim 11, wherein the central processing unit is further configured to automatically swap state information between the secondary storage device and the at least one programmable logic resource during programmable logic resource allocation using the virtual logic manager.*

*18. The system of claim 11, wherein the reconfigurable computer is scalable with respect to the programmable logic resources.*

*19. A system for optimizing the ability of a computer to execute a given application, the system comprising:*

*at least one programmable logic resource;*

*a memory device coupled to the central processing unit and to the at least one programmable logic resource; and*

*a central processing unit configured to:*

*during run-time of the application, automatically determine an available programmable logic resource bandwidth; and*

*during run-time of the application, based at least in part on the available programmable logic resource bandwidth, automatically swap configuration data between the memory device and the at least one programmable logic resource to reconfigure the at least one programmable logic resource.*

*20. The system of claim 19 wherein a virtual computer operating system runs on the central processing unit.*

* * * * *